(12) United States Patent
Hoang

(10) Patent No.: US 8,028,404 B2
(45) Date of Patent: Oct. 4, 2011

(54) MULTI-FUNCTION MODULE

(75) Inventor: Phan Hoang, Placentia, CA (US)

(73) Assignee: Virtium Technology, Inc., Rancho Santa Margarita, CA (US)

(*) Notice: Subject to any disclaimer, the term of this patent is extended or adjusted under 35 U.S.C. 154(b) by 0 days.

(21) Appl. No.: 12/818,084

(22) Filed: Jun. 17, 2010

(65) Prior Publication Data

US 2010/0251543 A1 Oct. 7, 2010

Related U.S. Application Data

(62) Division of application No. 12/345,536, filed on Dec. 29, 2008, now Pat. No. 7,762,818.

(51) Int. Cl.
*H05K 3/30* (2006.01)
*H05K 1/00* (2006.01)
*H01R 43/00* (2006.01)
*H01R 43/16* (2006.01)
*H01R 12/00* (2006.01)

(52) U.S. Cl. ........... 29/836; 29/825; 29/874; 439/62; 439/951

(58) Field of Classification Search ............ 29/825, 29/832, 836, 837, 842, 874, 884; 439/59–62, 439/328, 377, 629–633, 951
See application file for complete search history.

(56) References Cited

U.S. PATENT DOCUMENTS

| | | | | |
|---|---|---|---|---|
| 5,954,521 A * | 9/1999 | Yang | ............... | 439/59 |
| 6,425,766 B1 * | 7/2002 | Panella | ............... | 439/59 |
| 6,994,563 B2 * | 2/2006 | Amini et al. | ............... | 439/62 |
| 7,104,809 B1 * | 9/2006 | Huang | ............... | 439/76.1 |

* cited by examiner

*Primary Examiner* — A. Dexter Tugbang
*Assistant Examiner* — David Angwin
(74) *Attorney, Agent, or Firm* — Blakely Sokoloff Taylor & Zafman, LLP

(57) ABSTRACT

An embodiment is a method and apparatus to provide a multi-function module. A circuit board has a form factor and a connector edge corresponding to a first interface standard. The connector edge includes first and second groups of pin-outs that are mapped to pin-out assignments compatible with the first interface standard and a second interface standard, respectively. A first interface is provided on the circuit board for a first set of devices connected to the first group of pin-outs to operate according to the first interface standard. A second interface is provided on the circuit board for a second set of devices connected to the second group of pin-outs to operate according to the second interface standard.

10 Claims, 5 Drawing Sheets

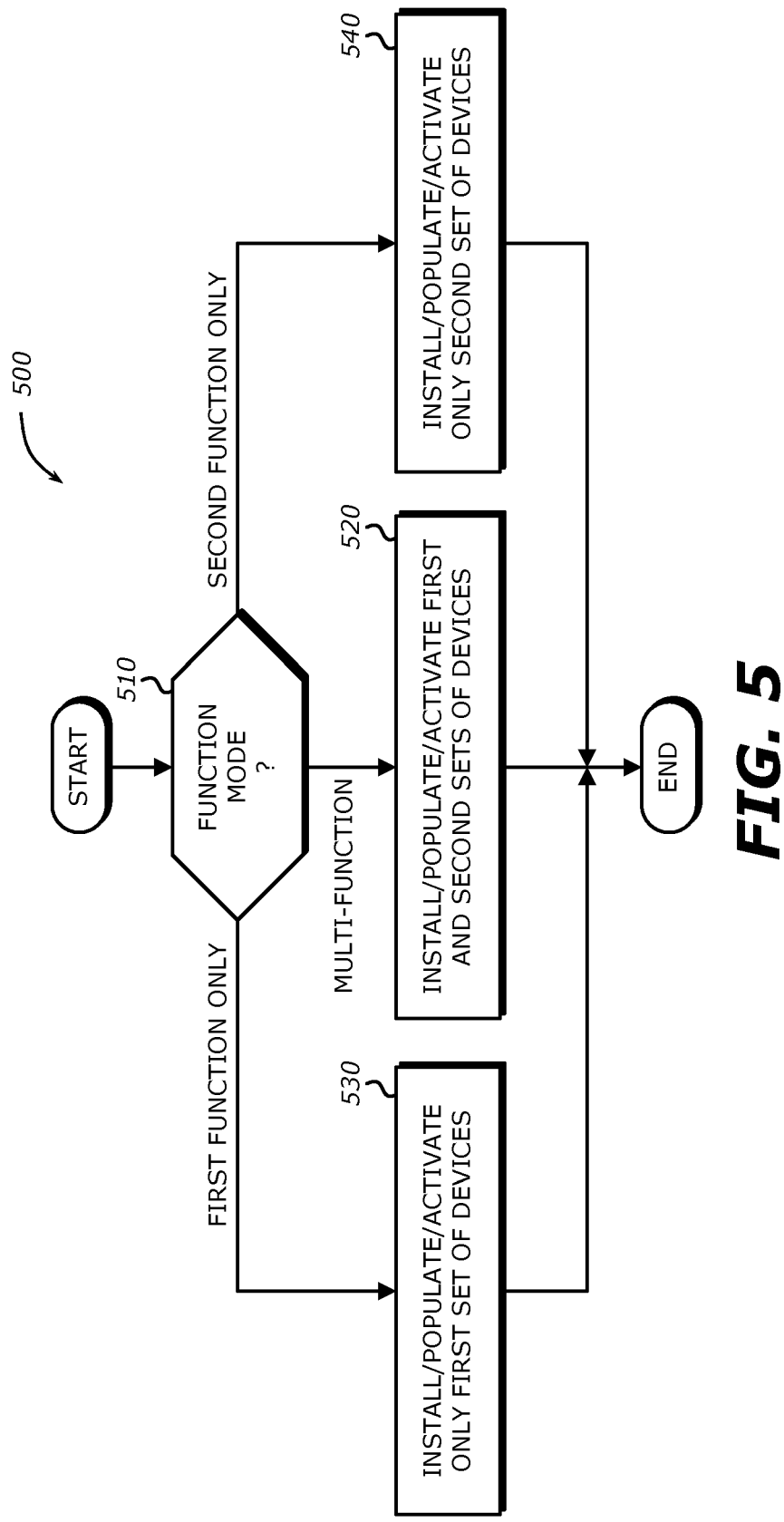

US 8,028,404 B2

MULTI-FUNCTION MODULE

TECHNICAL FIELD

The presently disclosed embodiments are directed to the field of integrated circuits, and more specifically, to interface module.

BACKGROUND

The proliferation of high performance processors has created opportunities in designing systems with highly integrated functionalities, small footprint, and versatility. Many applications require more and more functionalities within smaller and smaller packages or form factors. Examples of these applications are media systems, server computing, network computing, mobile devices, etc. Among the most important components in these applications is memory usage.

Virtually any microprocessor-based systems require two forms of memory: main memory and mass storage. Main memory is typically implemented by dynamic random access memory (DRAM) and mass storage is implemented by hard disk or solid state drive. Synchronous DRAM (SDRAM) is the current DRAM technology in modern computer systems. SDRAM family includes double data rate two (DDR2) and three (DDR3) devices with data transfer rates two times or eight times the data rate of the memory cells. Solid state drives (SSDs) have become increasingly popular as a replacement for magnetic hard drives in many applications. The storage on an SSD is handled by flash memory devices. Compared to magnetic hard drives, advantages of SSDs include less power usage, faster data access and higher reliability. Many applications require a significant amount of memory storage for both main memory and mass storage. In addition, it is desirable to reduce form factor or footprint of the overall system.

SUMMARY

One disclosed feature of the embodiments is a method and apparatus to provide a multi-function module. A circuit board has a form factor and a connector edge corresponding to a first interface standard. The connector edge includes first and second groups of pin-outs that are mapped to pin-out assignments compatible with the first interface standard and a second interface standard, respectively. A first interface is provided on the circuit board for a first set of devices connected to the first group of pin-outs to operate according to the first interface standard. A second interface is provided on the circuit board for a second set of devices connected to the second group of pin-outs to operate according to the second interface standard.

BRIEF DESCRIPTION OF THE DRAWINGS

Embodiments may best be understood by referring to the following description and accompanying drawings that are used to illustrate embodiments. In the drawings.

FIG. 5 is a flowchart illustrating a process to use the multi-function module according to one embodiment.

DETAILED DESCRIPTION

Figure 1:
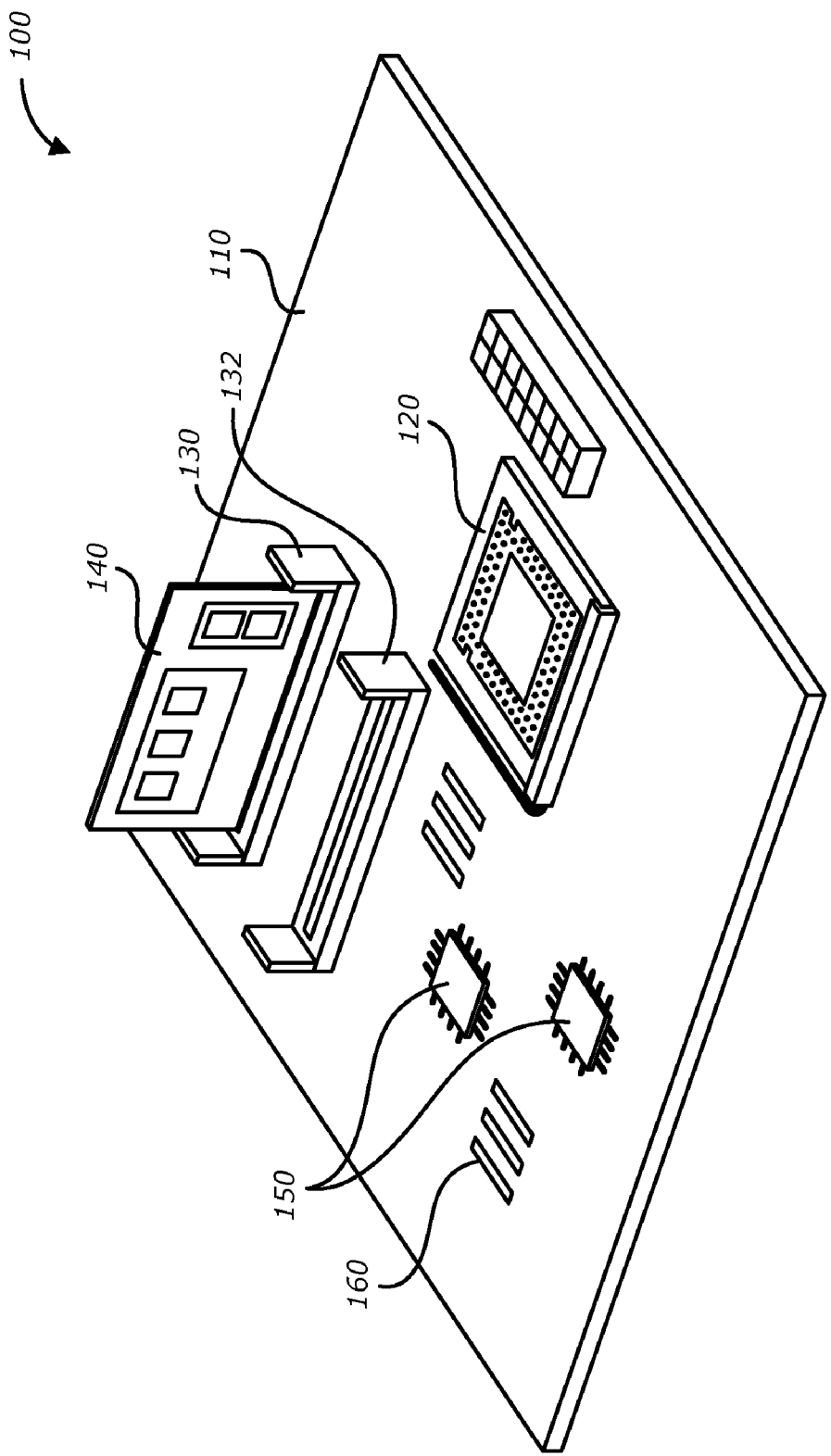
FIG. 1 is a diagram illustrating a system using a multi-function module according to one embodiment.

One disclosed feature of the embodiments is a technique to provide a multi-function module. A circuit board has a form factor and a connector edge corresponding to a first interface standard. The connector edge includes first and second groups of pin-outs that are mapped to pin-out assignments compatible with the first interface standard and a second interface standard, respectively. A first interface is provided on the circuit board for a first set of devices connected to the first group of pin-outs to operate according to the first interface standard. A second interface is provided on the circuit board for a second set of devices connected to the second group of pin-outs to operate according to the second interface standard.

In the following description, numerous specific details are set forth. However, it is understood that embodiments may be practiced without these specific details. In other instances, well-known circuits, structures, and techniques have not been shown to avoid obscuring the understanding of this description.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a technique to provide a multi-function module. A circuit board has a form factor and a connector edge corresponding to a first interface standard. The connector edge includes first and second groups of pin-outs that are mapped to pin-out assignments compatible with the first interface standard and a second interface standard, respectively. A first interface is provided on the circuit board for a first set of devices connected to the first group of pin-outs to operate according to the first interface standard. A second interface is provided on the circuit board for a second set of devices connected to the second group of pin-outs to operate according to the second interface standard.

The second group of pin-outs includes at least a pin-out assigned to a function that is not used, or optionally used, by the first interface standard. In one embodiment, this pin-out may be a No Connection (NC), Reserved for Future Use (RFU), TEST, etc. The TEST pin is usually used for testing purposes such as signal probing by a logic analyzer. In another embodiment, this pin-out may be a power or ground pin where the power or ground connection is disconnected so that it can be used for a function defined by the second interface standard. Since power and/or ground pins are usually provided redundantly, using one of these signals does not cause any problems for the functions defined by the first interface standard. In another embodiment, this pin may be an address line signal, such as the most significant bit of the address lines (e.g., A15 in a 16-bit address configuration). This address pin may be considered optional because its use depends on the particular arrangement and selection of the memory modules on the board.

The first group of pin-outs forms a functioning subset of the first interface standard. This subset may be equal to the complete set of the first interface standard or a set that has less functionality. For example, the first group of pin-outs may not have the test functionality if the TEST pin is not used in the first interface standard. In another example, the first group of pin-outs may not have an address line (e.g., the most significant bit of the address lines such as A15). In many applications, these functionalities may not be needed. Therefore, the first set of devices may still function at full performance according to the first interface standard.

In one embodiment, the first interface standard is a standard for memory modules. These memory modules may include DDR SDRAM, DDR2 SDRAM, DDR3 SDRAM, DDR4 SDRAM, dual-in-line memory module (DIMM), Fully Buffered (FB) DIMM, Very Low Profile (VLP) DIMM, Mini-DIMM, Micro-DIMM, and small outline (SO)DIMM. The standard for the memory modules may be provided by an industry standard organization, a manufacturer, a group of manufacturers, or any other standard authority. For example, the SO-DIMM standard specification is provided by Joint Electron Device Engineering Council (JEDEC). The first interface standard may include registered and unbuffered DIMMs and unbuffered SODIMMs. The number of pins in the connector edge may be 72, 100, 144, 168, 172, 184, 200, 204, 214, 240, and 244, or any number that is specified in the design specification provided by the standard (e.g., JEDEC standard). In addition to the electrical specifications, the first interface standard may also include the mechanical form factor of the card or the circuit board. The first set of devices that operate according to the memory module standard may include DDR, DDR2, DDR3, or DDR4, or any other compatible memory modules. Any JEDEC compatible DRAM modules may be used such as unbuffered, registered, fully buffered (FB), very low profile (VLP), micro-, and mini-DIMM.

In one embodiment, the second interface standard is a solid state drive (SSD) standard. The SSD standard may be a Serial Advanced Technology Attachment (SATA) standard or any other SSD standard that employs similar number of pins. The second set of devices includes at least a flash memory and an SSD controller. In one embodiment, the second group of pin-outs include pin-outs assigned to Tx+, Tx−, Rx+, and Rx− functions of the SATA standard as provided by the Serial ATA International Organization (SATA-IO)

One embodiment may be described in terms of the memory module (e.g., SO-DIMM) standard and the SSD standard. Other embodiments may include any other standards from any standard organizations including JEDEC and SATA-IO. In addition, it is noted that more than two interfaces on the circuit board for more than two sets of devices may also be provided as long as the connector edge on the circuit board has sufficient number of pin-outs to accommodate the functionalities of the multiple interface standards.

FIG. 1 is a diagram illustrating a system 100 using a multi-function module according to one embodiment. The system 100 includes a motherboard 110, a processor 120, connectors or sockets 130 and 132, devices 150, and discrete components 160. The system 100 may include more or less than the above components. The system 100 may be part of a computer system, an embedded control system, a printer adapter, a desktop computer, a laptop computer, a notebook computer, a mobile device, a personal digital assistant (PDA), or any system that may use a multi-function module.

The motherboard 110 may be any main board used in a system. It may have a compact size. It may have interfaces to peripheral devices such as hard drive, audio and video components, input and output devices (e.g., keyboard, mouse, display). The processor 120 may be any suitable processor. Examples of the processor 120 may be an integrated multi-core processor, digital signal processor, microcontroller, media processor, etc.

The connector or socket 130 or 132 may be any suitable expansion connector that has a pin-out configuration compatible with a first interface standard and a functional configuration corresponding to the first interface standard and a second interface standard. In one embodiment, the connector or socket 130 or 132 may be compatible to a memory module (e.g., SO-DIMM) connector. The memory module connector may have any suitable number of pins, such as 72, 100, 144, 168, 172, 184, 200, 204, 214, 240, and 244. It may be used to accommodate a multi-function module 140. The multi-function module 140 provides multiple functionalities that are compatible with multiple interface standards. It may provide interchangeability for multiple functionalities. In one embodiment, it may provide DDR, DDR2, or DDR3 memory modules and/or SATA storage. Depending on system configuration and/or requirements, the user may select the DDR functionality for DRAM modules, or the SATA functionality for SSD, or both.

The devices 150 may include any devices that may be used in conjunction with the processor 120. They may include a chipset, an audio controller, a graphics controller, a graphics media accelerator, or an input/output controller hub, etc. The discrete components 160 may include any discrete components such as resistors, capacitors, inductors, etc.

Figure 2:
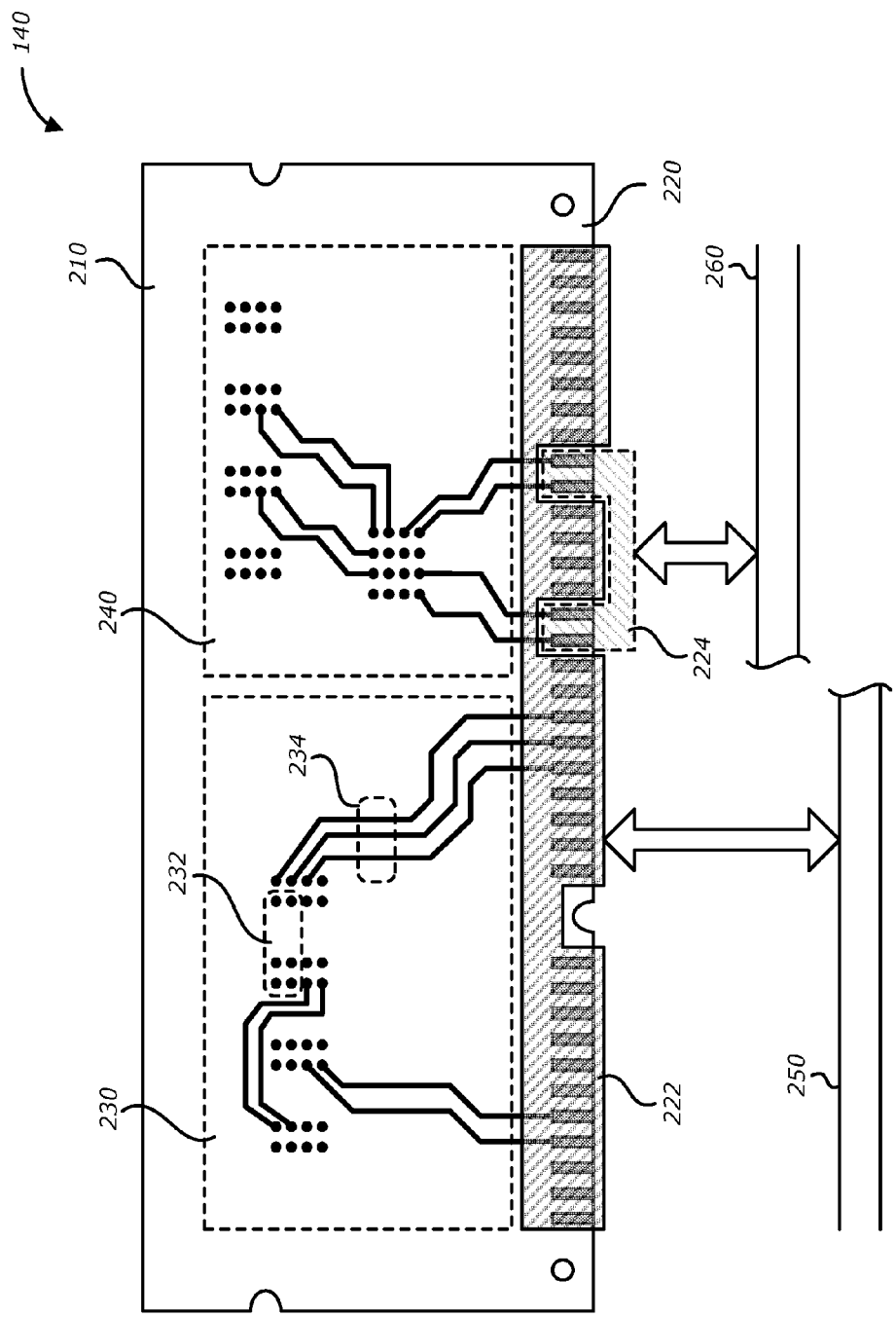
FIG. 2 is a diagram illustrating the multi-function module according to one embodiment.

FIG. 2 is a diagram illustrating the multi-function module 140 according to one embodiment. The multi-function module 140 includes a circuit board 210, a first interface 230 and a second interface 240. The multi-function module 140 may include more or less than the above components.

The circuit board 210 may have a form factor and a connector edge 220 corresponding to a first interface standard. The connector edge 220 may be gold plated. It includes first and second groups 222 and 224 of pin-outs that are mapped to pin-out assignments compatible with the first interface standard and a second interface standard, respectively. The first group 222 may correspond to a first set of signal 250 operating in accordance to the first interface standard. The second group 224 may correspond to a second set of signal 250 operating in accordance to the first interface standard.

The first interface 230 is provided on the circuit board 210 for a first set of devices connected to the first group 222 of pin-outs to operate according to the first interface standard. The first interface 230 may include lay-out having contacts 232, traces 234, power and/or ground planes, sockets, vias, etc. that are designed to accommodate the installation of the first set of devices. In one embodiment, the first set of devices includes DDR, DDR2, DDR3, or DDR4 SDRAM modules. The first set of devices may also include a temperature sensor or any other devices that are intended for use with the first interface standard. In one embodiment, the first set of signal 250 that is mapped to the first group 222 may include address signals, data signals, and control signals.

The second interface 240 is provided on the circuit board 210 for a second set of devices connected to the second group 224 of pin-outs to operate according to the second interface standard. The second interface 240 may include lay-out having contacts 242, traces 244, power and/or ground planes, sockets, vias, etc. that are designed to accommodate the installation of the second set of devices. In one embodiment, the second set of devices includes at least a flash memory and a SATA controller. The second set of devices may also include power converter to provide appropriate power supplies to the flash and SATA controller devices. In one embodiment, the second set of signal 260 that is mapped to the second group 224 may include SATA signals such as Tx+, Tx−, Rx+, and Rx− differential signals.

In one embodiment, the multi-function module is a dual-function module that combines both DDR and SSD functionalities. It may be referred to as a Solid State Double Data Rate (SSDDR) module. It supports a memory module interface standard including 100-pin, 144-pin, 200-pin, and 204-pin SODIMM, or other DIMM, Mini-DIMM, Micro-DIMM, as described above. The first set of devices may include DDR2, DDR3, or DDR4 memory modules. The memory capacity may be up to any limit (e.g., 1 GB, 2 GB, or 4 GB) using suitable memory modules (e.g., 128M×64, 256M×64). It also supports SATA interface standard including SATA I and SATA II compliance. The second set of devices includes NAND flash devices with error correction and single level (SCL) memory cells and SATA controller. The flash capacity may be up to any limit (e.g., 4 GB, 8 GB, or 16 GB) using suitable flash devices. In addition, since the power supplies for the SDRAM devices and the NAND flash devices may be different, a voltage regulator is used to provide power supply for the NAND flash devices (e.g., from 1.5 V to 3.3 V). The data transfer rates for the SSD may be 64 MB/sec for read and 45 MB/sec for write, or up to 200 MB/sec.

The SSDDR module uses a special layout technique to carry the Tx+, Tx−, Rx+, and Rx− SATA signals through the memory module connector to maintain signal integrity. The traces for the differential signal pairs are kept short at the outer layer at the memory module connector. They are short traces from the module finger at the memory module connector to bypassing capacitors, then drop via to run on an internal layer and remain in the internal layer till they reach the SATA controller on the component layer.

The SSDDR module offers a number of advantages. First, it provides a long-term sustainable solution having SATA storage capability directly on the motherboard. Second, it is easy for adoption by virtue of using the industry standard memory module connector or socket. Third, it provides storage capacities (e.g., 4 GB SDRAM and 8 GB SSD) that are suitable for many applications. Fourth, it provides faster boot time and access time than conventional mass storage configuration. Fifth, it provides flexibility of using both SDRAM and SSD on existing memory module connector or socket on the motherboard. Sixth, it provides significant space saving over the use of consumer storage cards such as Compact Flash (CF), Secure Digital (SD), or Universal Serial Bus (USB) storage cards. Seventh, it provides simplified life cycle management for both main memory and mass storage functions.

Figure 3:
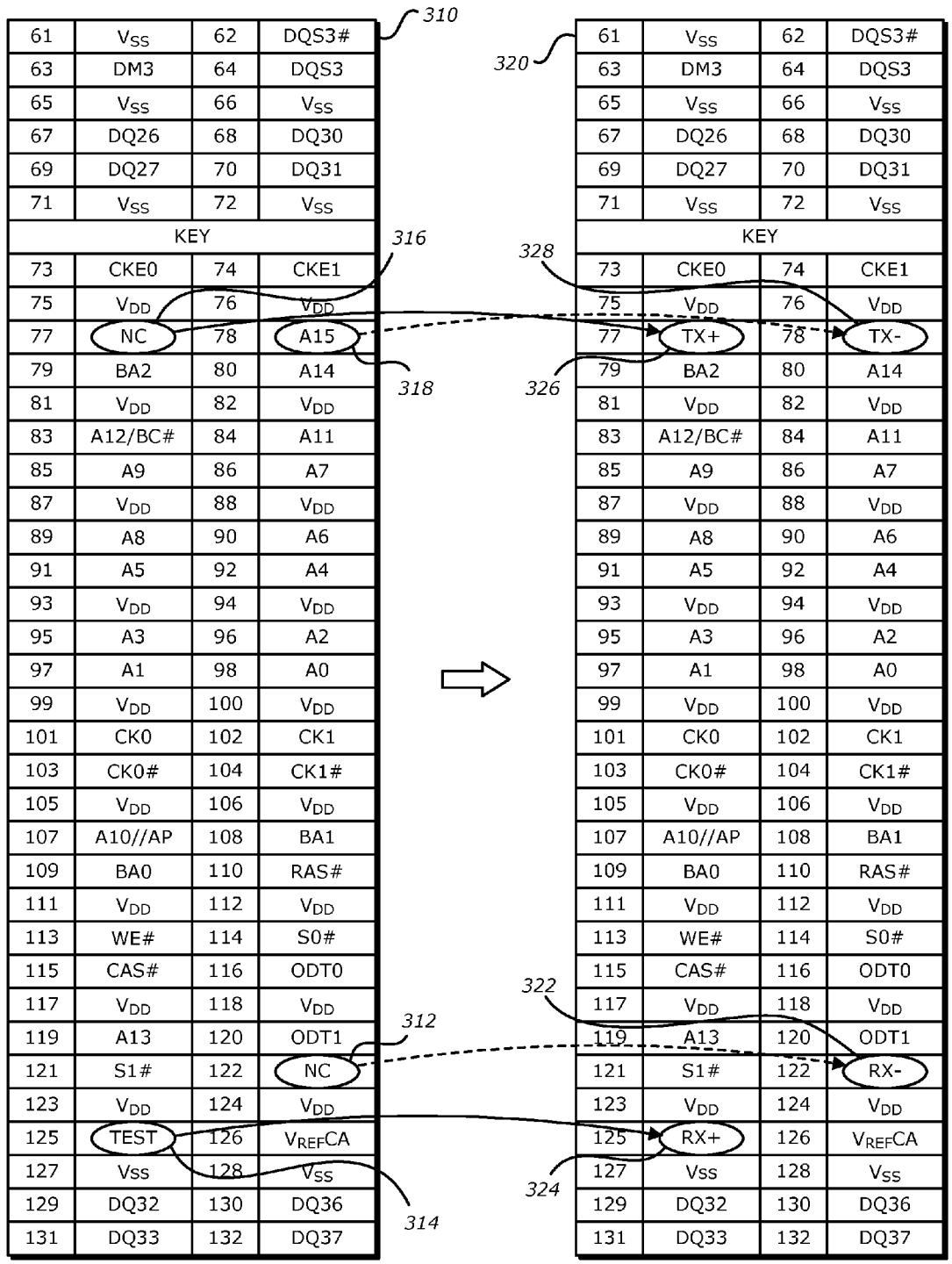
FIG. 3 is a diagram illustrating a mapping of pin-outs according to one embodiment.

FIG. 3 is a diagram illustrating a mapping of pin-outs according to one embodiment. The mapping maps a pin-out assignment 310 to a pin-out assignment 320. The pin-out assignment 310 is compatible with the first interface standard and the pin-out assignment corresponds to the multi-function assignment of the multi-function module 140 shown in FIG. 1.

The pin-out assignment 310 includes pins that are used for the first interface standard. It may include pins that are not used or optionally used in the first interface standard. For illustrative purposes, the pin-out diagram shown in FIG. 3 is for a SO-DIMM pin-out assignment. The pin-out assignment 310 includes a NC (no connection) pin 312, a TEST pin 314, a NC (no connection) pin 316, and an address pin A15 318.

The pin-out assignment 320 includes pins that are used for the first interface standard and pins that are used for the second interface standard. The pins that are used for the second interface standard form the second group 224 shown in FIG. 2 and the remaining pins form the first group 222 shown in FIG. 2. In one embodiment, the second group 224 includes a Rx− pin 322, a Rx+ pin 324, a Tx+ pin 326, and a Tx− pin 328 that correspond to the SATA signals.

The NC pin 312, the TEST pin 314, the NC pin 316, and the address pin A15 318 are mapped to the Rx− pin 322, the Rx+ pin 324, the Tx+ pin 326, and the Tx− pin 328, respectively, on the pin-out assignment 320. To maintain signal integrity, the pair Rx+ 324 and Rx− 322 are selected to be close to each other. Similarly, the pair Tx+ 326 and Tx− 328 are selected to be close to each other.

The selection of the pins on the pin-out assignment 310 to map to the pin-out assignment 320 depends on the pin function. Typically, the pin on the pin-out assignment 310 that is used to map to the pin-out assignment 320 is a no-connection pin, a not-used pin, a reserved for future use pin, an optional pin, or a pin that is of little use in the first interface standard. In another embodiment, the pin may be a ground pin.

Figure 4:
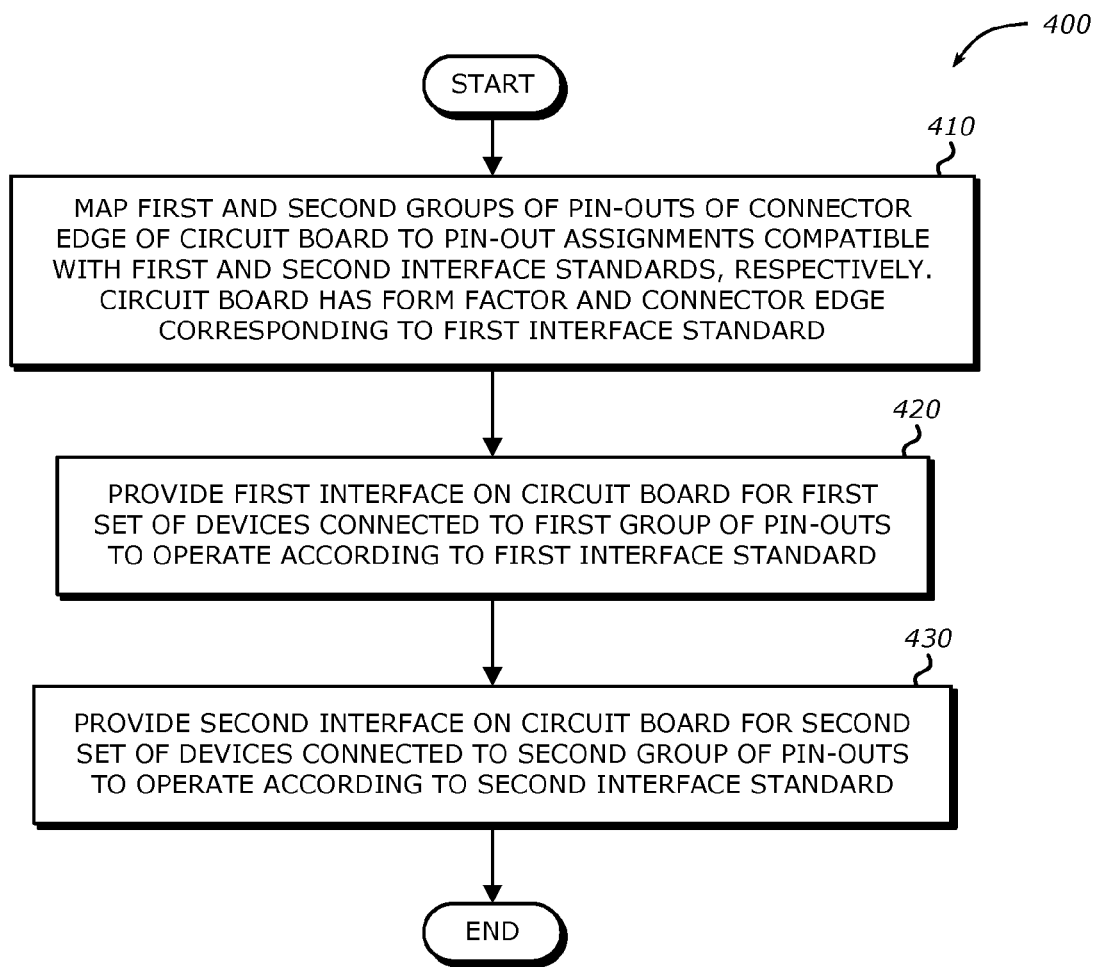
FIG. 4 is a flowchart illustrating a process to provide the multi-function module according to one embodiment.

FIG. 4 is a flowchart illustrating a process to provide the multi-function module according to one embodiment.

Upon START, the process 400 maps first and second groups of pin-outs of a connector edge of a circuit board to pin-out assignments compatible with first and second interface standards, respectively (Block 410). The circuit board has a form factor and the connector edge corresponding to the first interface standard. The first group of pin-outs may form a functioning subset of the first interface standard. The second group of pin-outs may include at least a pin-out assigned to a function that is not used, or optionally used, by the first interface standard. In one embodiment, the first interface standard is a memory module standard and the second interface standard is a SSD standard (e.g., SATA standard).

Next, the process 400 provides a first interface on the circuit board for a first set of devices connected to the first group of pin-outs to operate according to the first interface standard (Block 410). The first interface may include a layout having contacts, traces, power and/or ground planes, sockets, vias, etc. that are designed to accommodate the installation of the first set of devices. In one embodiment, the first set of devices includes DDR, DDR2, DDR3, or DDR4 SDRAM modules.

Then, the process 400 provides a second interface on the circuit board for a second set of devices connected to the second group of pin-outs to operate according to the second interface standard. The second interface may include a layout having contacts, traces, power and/or ground planes, sockets, vias, etc. that are designed to accommodate the installation of the second set of devices. In one embodiment, the second set of devices includes at least a flash memory and a SATA controller. The second set of devices may also include power converter to provide appropriate power supplies to the flash and SATA controller devices. The process 400 is then terminated at the END.

FIG. 5 is a flowchart illustrating a process 500 to use the multi-function module according to one embodiment.

Upon START, the process 500 determines the function mode of the multi-function module (Block 510). The function mode may include use of a single mode, a subset of the function modes, or a complete set of the function modes. For illustrative purposes, only three modes are shown. If the function mode is the multi-mode function, the process 500 installs, populates, or activates the first and second sets of devices (Block 520) and is then terminated at the END. If the function mode is the first function only, the process 500 installs, populates, or activates only the first set of devices (Block 530) and is then terminated at the END. If the function mode is the second function only, the process 500 installs, populates, or activates only the second set of devices (Block 540) and is then terminated at the END.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method comprising:
    mapping first and second groups of pin-outs of a connector edge of a circuit board to pin-out assignments compatible with first and second interface standards, respectively, the circuit board having a form factor and the connector edge corresponding to the first interface standard;
    providing a first interface on the circuit board for a first set of devices connected to the first group of pin-outs to operate according to the first interface standard; and
    providing a second interface on the circuit board for a second set of devices connected to the second group of pin-outs to operate according to the second interface standard.

2. The method of claim 1 wherein the second group of pin-outs includes at least a pin-out assigned to a function that is not used, or optionally used, by the first interface standard.

3. The method of claim 1 wherein the first group of pin-outs forms a functioning subset of the first interface standard.

4. The method of claim 1 wherein the first interface standard is a dual-in-line memory module (DIMM) standard.

5. The method of claim 1 wherein the second interface standard is a solid state drive (SSD) standard.

6. The method of claim 5 wherein the SSD standard is a Serial Advanced Technology Attachment (SATA) standard.

7. The method of claim 4 wherein the first set of devices includes at least a synchronous dynamic random access memory (SDRAM).

8. The method of claim 7 wherein the SDRAM is a double data rate (DDR), a DDR2, DDR3, or a DDR4 SDRAM.

9. The method of claim 5 wherein the second set of devices includes at least a flash memory and a solid state drive (SSD) controller.

10. The method of claim 6 wherein the second group of pin-outs include pin-outs assigned to Tx+, Tx−, Rx+, and Rx− functions of the SATA standard.

* * * * *